United States Patent [19]

O'Leary

[11] Patent Number: 4,746,875
[45] Date of Patent: May 24, 1988

[54] DIFFERENTIAL AMPLIFIER USING N-CHANNEL INSULATED-GATE FIELD-EFFECT TRANSISTORS

[75] Inventor: Paul O'Leary, Gundelfingen, Fed. Rep. of Germany

[73] Assignee: Deutsche ITT Industries GmbH, Freiburg, Fed. Rep. of Germany

[21] Appl. No.: 27,742

[22] Filed: Mar. 19, 1987

[30] Foreign Application Priority Data

Mar. 21, 1986 [EP] European Pat. Off. ........ 86103882.6

[51] Int. Cl.$^4$ ............................ H03F 3/45; H03F 3/16
[52] U.S. Cl. ...................................... 330/253; 330/277
[58] Field of Search ................. 330/253, 277, 300, 307

[56] References Cited

U.S. PATENT DOCUMENTS 3,970,951  7/1976  Hoffman ............................... 330/30
4,563,654  1/1986  Arai et al. ........................ 330/253 X

FOREIGN PATENT DOCUMENTS 0121688  10/1984  European Pat. Off. .................. 1/32
2150380   6/1985  United Kingdom ..................... 3/45

OTHER PUBLICATIONS

IEEE Journal of Solid-State Circuits, vol. SC-19, "A Linear NMOS Depletion Resistor and Its Application in an Integrated Amplifier", J. N. Babanezhad, pp. 932-938.

Primary Examiner—Eugene R. LaRoche
Assistant Examiner—Steven J. Mottola
Attorney, Agent, or Firm—Thomas L. Peterson

[57] ABSTRACT

For the purpose of achieving a small as possible distortion factor in the case of high-frequency input signals, the load resistors in this differential amplifier are designed as depletion resistors (DEPRs) of the type known per se. Likewise, in the common source circuit, there is provided the further DEPR, with the two transistors thereof having the same width-to-length ratios. Moreover, each of the amplifier transistors has a constant-current transistor of its own which, together with both the transistor and the DEPR, as well as the transistor which is connected as a diode, form the constant-current circuit. The respective width-to-length ratios of the transistors of the DEPRs differ from one another.

1 Claim, 1 Drawing Sheet

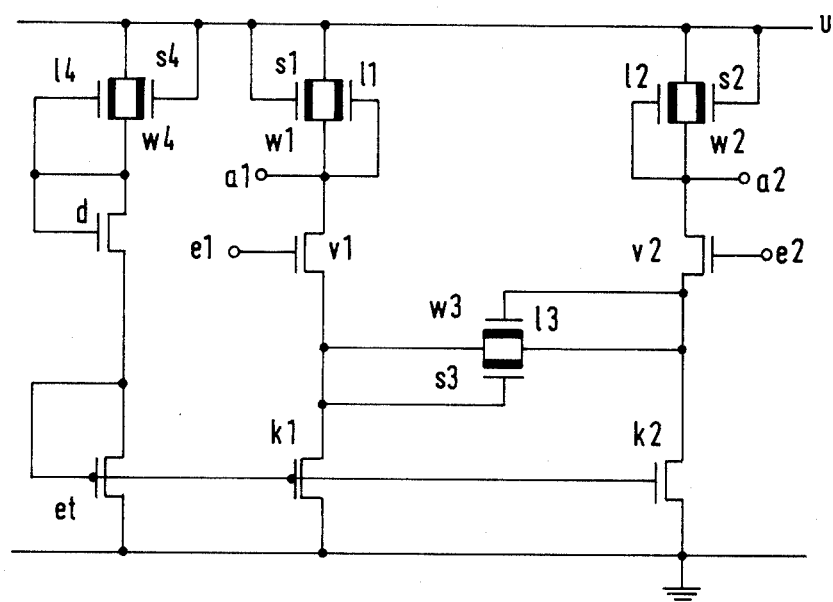

DIFFERENTIAL AMPLIFIER USING N-CHANNEL INSULATED-GATE FIELD-EFFECT TRANSISTORS

BACKGROUND OF THE INVENTION

The present invention relates to differential amplifiers using n-channel insulated-gate field-effect transistors, in which the one end of the source-drain section of each amplifier transistor of the enhancement type, each by way of a load transistor of the depletion type whose gate is connected to the source thereof, is applied to the voltage-conducting pole of a source of operating voltage, while the other end, by way of a common constant-current circuit using at least one constant-current transistor of the enhancement type, is connected to the zero point of the circuit (ground), cf, the preamble of the patent claim.

A differential amplifier of this type is disclosed in the earlier published European Patent Application EP-A No. 0 139 078, especially in connection with FIG. 1 thereof. Since depletion-made transistors are used as load resistors of the amplifier transistors, the distortions of this amplifier are mainly determined by these depletion-mode transistors, i.e. in two different ways, namely on one hand by the chiefly square current-voltage characteristic of the load transistor and, on the other hand, by the dependence of the gate-threshold voltage upon the source-drain voltage. In the case of a monolithic integration it would be possible to provide polysilicon resistors instead of the depletion-mode transistors. These, however, would take up too much space on the crystal surface of the integrated circuit and, moreover, would also be subjected to considerable fabrication process variations.

SUMMARY OF THE INVENTION

Accordingly, it is the object of the invention as circumscribed in the patent claim, and by starting out from the previously described circuit, to provide a differential amplifier which, also when amplifying high-frequency input signals, shows to have a small as possible distortion. According to the invention, this is accomplished by way of amending the depletion-load transistors to form depletion resistors (DEPRs) of the type known per se, as well as by providing a further DEPR disposed in the source circuit of the two amplifier transistors, which, however, with respect to the width-to-length ratio of the channel of its transistors, is dimensioned differently than the load DEPRs.

The aforementioned depletion resistors (DEPRs) are described in an article published on pages 932 to 938 of the "IEEE J. Sol. St. Circ." for December 1984. In this publication, however, it is shown that they may be used as the outer additional network in the feedback circuit of operational amplifiers (op amps), but in particular also the crystal photomicrographs in FIG. 8 on page 937 just do not show that the authors of this article have thought of using these DEPRs as load resistors within the operational amplifier and, consequently, its differential amplifying stages.

From the German Offenlegungsschrift DE-A No. 20 19 283 it is known per se with respect to differential amplifiers realized by using bipolar transistors, to provide in the emitter circuit of the amplifier transistors, for each of them one constant-current transistor, and to interconnect the emitters across a resistor network.

BRIEF DESCRIPTION OF THE DRAWING

In the following, the invention will now be explained in greater detail with reference to the only FIGURE of the accompanying drawing which shows the circuit diagram relating to one example of embodiment of the differential amplifier.

DETAILED DESCRIPTION OF THE DRAWING

As is customary with differential amplifiers and well known since long, amplifier transistors v1, v2 of the enhancement type are provided for in the showing of FIG. 1. In this, the source-drain section, via the load transistor l1, l2, of the depletion type, is connected to the voltage-conducting pole u of the source of operating voltage and, on the other hand, by way of the source-drain section of the constant-current transistor k1, k2 of the enhancement type, to the zero point of the circuit (ground). The gates of each of the load transistors l1, l2, are connected to the sources thereof, thus acting as constant-current sources.

According to one feature of the invention, the load transistors l1, l2 are in such a way amended to form the depletion resistors (DEPRs) w1, w2 that in parallel with their source-drain sections there are connected those of the shunt transistors s1, s2, with the gates thereof each being connected to the drains thereof, and thus applied to the voltage-conducting pole u.

To the respective gate of the amplifier transistors v1, v2 there are fed the input signals e1, e2, and the output signals are to be taken off at the point connecting both the amplifier transistor and the depletion resistor. The other ends with respect to this connecting point, of the source-drain section of the amplifier transistors v1, v2 are connected to one another across the third depletion resistor w3. Relative thereto, this resistor again consists of two depletion transistors l3, s3 which are connected in parallel with their source-drain sections and serve to connect the source of the amplifier transistor v1 to that of the amplifier transistor v2. The gate of transistor l3 is connected to the source of the amplifier transistor v2, while the gate of transistor s3 is connected to the source of the amplifier transistor v1.

The constant-current transistors k1, k2 are in such a way included in a constant-current circuit that the gates thereof are applied to the gate of the current-determining input transistor et of the constant-current circuit, which is like-wise of the enhancement type. The gate of this transistor is connected to the drain thereof, and its source-drain section is applied on one hand to the zero point of the circuit (ground) and, on the other hand, in this order of sequence, by way of the enhancement-type transistor d which is connected as a diode, and by way of the fourth depletion resistor w4, to the voltage conducting pole u.

This fourth depletion resistor w4, too, consists of the transistors l4, s4 which are arranged in parallel with their source-drain sections, with the gate of transistor s4 being connected to the voltage-conducting pole u, and the gate of transistor l4 being applied to the point connecting the transistor d and the resistor w4. The last-mentioned transistor likewise shows to have a gate-to-drain connection.

With the invention, moreover, the intended great freedom from distortion results from correspondingly dimensioning the respective width-to-length ratio, also known as the W/L ratio, of the employed four DEPRs.

Thus, both transistors 13, s3 of the third DEPR w3 within the common source circuit of the amplifier transistors v1, v2 show to have the same width-to-length ratio. This dimensioning rule in fact deviates from the prescribed dimensioning of the DEPR referred to on page 933 of the aforementioned prior art publication.

On the other hand, with the invention, the remaining DEPRs w1, w2, w4 are so dimensioned that the width-to-length ratios of their respective transistors s1, l1; s2, l2; s4, l4 differ from one another and are capable of being adjusted differently with respect to each individual DEPR.

In one realized circuit there has been measured with respect to high-frequency input signals a total distortion factor of 0.2 percent. In that case the gain factor is independent of the threshold voltage of the DEPRs.

What is claimed is:

1. An integrated circuit comprising:
   a voltage bus and a circuit ground;
   a differential amplifier having first and second n-channel, insulated-gate, field effect amplifier transistors of an enhancement type, each of said first and second amplifier transistors having a source, drain and gate, said source and drain of each of said amplifier transistors forming a source-drain section, each said source-drain section having first and second ends, one of said first and second ends corresponding to the source and the other of said first and second ends corresponding to the drain;
   a first constant-current transistor, having a source, drain and gate, one of the source and drain of said first constant-current transistor electrically connected to said second end of said source-drain section of said first amplifier transistor, the other of said source and drain of said first constant-current transistor electrically connected to said circuit ground;
   a second constant-current transistor, having a source, drain and gate, one of the source and drain of said second constant-current transistor electrically connected to said second end of said source-drain section of said second amplifier transistor, the other of said source and drain of said second constant-current transistor electrically connected to said circuit ground;
   a transistor of an enhancement type having a source, drain and gate, one of said source and drain electrically connected to said gate so that said transistor operates as a diode, one of said source and drain being a first end of said transistor and the other of said source and drain being a second end of said transistor;
   a constant-current input transistor of an enhancement type, having a source, drain and gate, said source and gate forming a source-drain section of said constant-current input transistor having first and second ends, one of said first and second ends of said source-drain section corresponding to the source and the other of said first and second ends corresponding to the drain, the first end electrically connected to said circuit ground, the second end of said source-drain section electrically connected to said gate of said constant-current input transistor and also connected to said gate of said first constant-current transistor and said gate of said second constant-current transistor, said second end further electrically connected to said first end of said transistor operating as a diode; and
   first, second, third and fourth depletion resistors, each of said first, second, third and fourth depletion resistors comprising:
      a load transistor of a depletion type, having a source, drain and gate, said gate of said load transistor electrically connected to said source of said load transistor, said source and drain forming a source-drain section having a first end corresponding to one of said source and drain and having a second end corresponding to the other of said source and drain; and
      a shunt transistor, having a source, drain, and gate, said source and drain forming a source-drain section, said gate of said shunt transistor connected to said drain of said shunt transistor, the source-drain section of said shunt transistor electrically connected in parallel with the source-drain section of said load transistor,
   wherein:
      said first end of said source-drain section of said load transistor of said first depletion resistor is electrically connected to said first end of said source-drain section of said first amplifier transistor, and said second end of said load transistor of said first depletion resistor is electrically connected to said voltage bus;
      said first end of said source-drain section of said load transistor of said second depletion resistor is electrically connected to said first end of said source-drain section of said second amplifier transistor, and said second end of said load transistor of second depletion resistor is electrically connected to said voltage bus;
      said first end of said source-drain section of said load transistor of said third depletion resistor is electrically connected to said second end of said source-drain section of said first amplifier transistor, and said second end of said load transistor of said third depletion resistor is electrically connected to said second end of said second amplifier transistor; and
      said first end of said source-drain section of said load transistor of said fourth depletion resistor is electrically connected to said second end of said transistor operating as a diode, and said second end of said load transistor of said fourth depletion resistor is electrically connected to said voltage bus;
   and wherein:
      said load transistor and said shunt transistor of said third depletion resistor each includes a depletion channel having a length and a width, the width-to-length ratio of said depletion channel of said load transistor of said third depletion resistor being substantially equal to the width-to-length ratio of said depletion channel of said shunt transistor of said third depletion resistor; and
      each of said load transistors of said first, second and fourth depletion resistors and each of said shunt transistors of said first, second and fourth depletion resistors includes a depletion channel having a length and a width, the width-to-length ratio of the depletion channel of the load transistor of each of said first, second and fourth depletion resistors differing from the length-to-width ratio of the corresponding shunt transistor of each of said first, second and fourth depletion resistors.

* * * * *